United States Patent
Edge et al.

(10) Patent No.: US 9,093,558 B2
(45) Date of Patent: Jul. 28, 2015

(54) INTEGRATION OF MULTIPLE THRESHOLD VOLTAGE DEVICES FOR COMPLEMENTARY METAL OXIDE SEMICONDUCTOR USING FULL METAL GATE

(75) Inventors: Lisa F. Edge, Watervliet, NY (US); Hemanth Jagannathan, Guilderland, NY (US); Balasubramanian S. Haran, Watervliet, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 153 days.

(21) Appl. No.: 13/594,772

(22) Filed: Aug. 24, 2012

(65) Prior Publication Data

US 2014/0054717 A1 Feb. 27, 2014

(51) Int. Cl.
*H01L 21/8238* (2006.01)
*H01L 21/28* (2006.01)
*H01L 29/49* (2006.01)
*H01L 29/51* (2006.01)

(52) U.S. Cl.
CPC .. *H01L 21/823835* (2013.01); *H01L 21/28088* (2013.01); *H01L 21/823842* (2013.01); *H01L 29/4966* (2013.01); *H01L 29/517* (2013.01)

(58) Field of Classification Search
USPC ............ 438/233, 902; 257/E21.204, E21.635
See application file for complete search history.

(56) References Cited

U.S. PATENT DOCUMENTS

| | | | |
|---|---|---|---|
| 6,281,559 B1 | 8/2001 | Yu | |
| 6,846,734 B2 | 1/2005 | Amos | |
| 7,297,586 B2 * | 11/2007 | Triyoso et al. | 438/216 |
| 7,718,496 B2 | 5/2010 | Frank | |
| 7,754,594 B1 | 7/2010 | Chudzik | |
| 7,855,105 B1 | 12/2010 | Jagannathan | |
| 2003/0029242 A1 | 2/2003 | Yaralioglu | |
| 2006/0051961 A1 | 3/2006 | Cabral, Jr. | |
| 2007/0111419 A1 | 5/2007 | Doyle | |
| 2008/0274611 A1 | 11/2008 | Cabral, Jr. | |
| 2010/0052067 A1 * | 3/2010 | Hsu et al. | 257/369 |
| 2010/0276753 A1 | 11/2010 | Greene | |
| 2010/0308412 A1 | 12/2010 | Jagannathan | |
| 2010/0320545 A1 | 12/2010 | Jagannathan | |
| 2011/0081754 A1 | 4/2011 | Jagannathan | |
| 2011/0081765 A1 | 4/2011 | Cummings | |
| 2011/0108921 A1 * | 5/2011 | Kanakasabapathy et al. | 257/369 |
| 2011/0115026 A1 | 5/2011 | Jagannathan | |

(Continued)

OTHER PUBLICATIONS

M. M. Hussain et al., "Gate-First Integration of Tunable Work Function Metal Gates of Different Thicknesses . . . for Multi-VTh Engineering," IEEE vol. 57, Issue 3, Mar. 2010.

(Continued)

*Primary Examiner* — Chandra Chaudhari
(74) *Attorney, Agent, or Firm* — Daniel P. Morris; Otterstedt, Ellenbogen & Kammer, LLP

(57) ABSTRACT

A substrate is provided, having formed thereon a first region and a second region of a complementary type to the first region. A gate dielectric is deposited over the substrate, and a first full metal gate stack is deposited over the gate dielectric. The first full metal gate stack is removed over the first region to produce a resulting structure. Over the resulting structure, a second full metal gate stack is deposited, in contact with the gate dielectric over the first region. The first and second full metal gate stacks are encapsulated.

12 Claims, 8 Drawing Sheets

(56) References Cited

U.S. PATENT DOCUMENTS

2011/0115027 A1 5/2011 Jagannathan
2012/0153398 A1* 6/2012 Baars et al. .................. 257/369

OTHER PUBLICATIONS

A. Veloso et al., "Flexible and robust capping-metal gate integration technology enabling multiple-VT CMOS in MuGFETs," 2008 Symposium on VLSI Technology, Jun. 17-19, 2008.

K. Cheng et al., "Extremely Thin SOI (ETSOI) Technology: Past, Present, and Future," IEEE International SOI Conference (SOI), 2010.

C. Fenouillet-Beranger et al., "Hybrid FDSOI/Bulk high-k/Metal gate platform . . . technology". IEEE International Electron Devices Meeting (IEDM), Dec. 7-9, 2009.

H.-C. Wen et al., "Gate First Metal-Aluminum-Nitride PMOS Electrodes for 32nm Low Standby Power Applications," IEEE Symposium on VLSI Technology, Jun. 12-14, 2007.

* cited by examiner

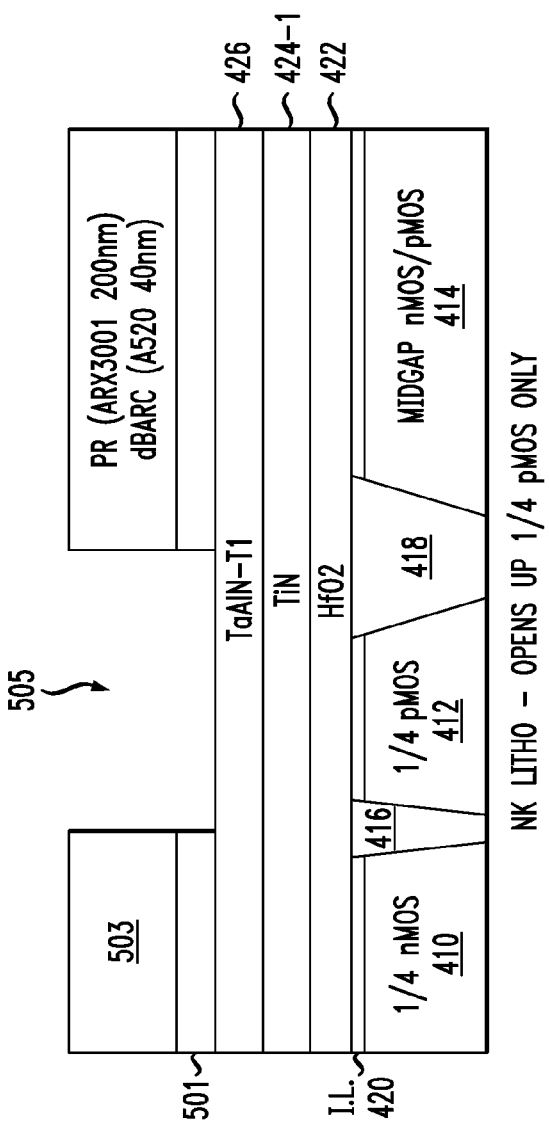
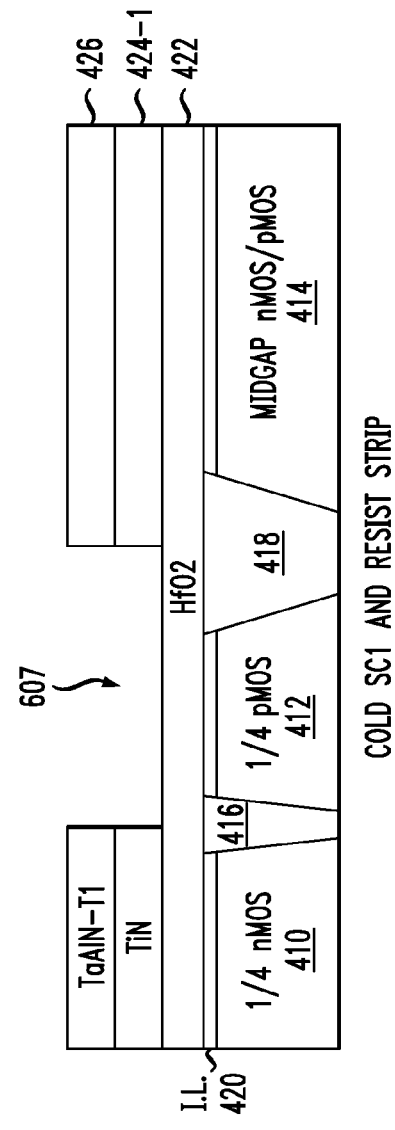
FIG. 5
FIG. 6

INTEGRATION OF MULTIPLE THRESHOLD VOLTAGE DEVICES FOR COMPLEMENTARY METAL OXIDE SEMICONDUCTOR USING FULL METAL GATE

STATEMENT OF GOVERNMENT RIGHTS

Not Applicable.

CROSS-REFERENCE TO RELATED APPLICATIONS

Not Applicable.

FIELD OF THE INVENTION

The present invention relates to the electrical, electronic and computer arts, and, more particularly, to silicon device and integration technology and the like.

BACKGROUND OF THE INVENTION

Scaling bulk technology beyond the 20 nm node faces formidable challenges, particularly for low power (LP) applications, partially due to the competing requirements of density, power, and performance, and partially due to increased device variation and parasitics. System-on-chip (SoC) applications require various sets of transistors to achieve optimal tradeoff between power and performance.

Furthermore, as the pitch continues to scale, being able to land contacts in the correct location becomes more and more difficult. Full metal gate technology enables implementation of self-aligned contacts. Multiple threshold voltage (Vt) is a significant technology requirement for SoC applications. Fully depleted devices such as extremely thin silicon-on-insulator (ETSOI) or FinFET (fin-type field effect transistor) typically require work function tuning to obtain different Vt, which cannot be done through channel doping.

SUMMARY OF THE INVENTION

Principles of the invention provide techniques for integration of multiple threshold voltage devices for complementary metal oxide semiconductor using full metal gate. In one aspect, an exemplary method includes the step of providing a substrate having formed thereon a first region and a second region of a complementary type to the first region; depositing over the substrate a gate dielectric; depositing over the gate dielectric a first full metal gate stack; removing the first full metal gate stack over the first region to produce a resulting structure; depositing over the resulting structure a second full metal gate stack, in contact with the gate dielectric over the first region; and encapsulating the first and second full metal gate stacks.

In another aspect an exemplary circuit structure includes a substrate having formed thereon a first transistor having a source, a drain, and a channel; and a second transistor having a source, a drain, and a channel, and being of a complimentary type to the first transistor. Also included are a first full metal gate stack formed over the channel of the first transistor; a second full metal gate stack formed over the channel of the second transistor; a first encapsulation enclosing the first full metal gate stack; a second encapsulation enclosing the second full metal gate stack; a silicided contact between the first and second encapsulations; and a self-aligned contact projecting from the silicided contact. The first full metal gate stack is formed of material which tunes the first transistor to a first threshold voltage and the second full metal gate stack is formed of material which tunes the second transistor to a second threshold voltage different than the first threshold voltage.

As used herein, "facilitating" an action includes performing the action, making the action easier, helping to carry the action out, or causing the action to be performed. Thus, by way of example and not limitation, instructions executing on one computer processor might facilitate an action carried out by a piece of semiconductor processing equipment, by sending appropriate command(s) to cause or aid the action to be performed. For the avoidance of doubt, where an actor facilitates an action by other than performing the action, the action is nevertheless performed by some entity or combination of entities.

Techniques of the present invention can provide substantial beneficial technical effects. For example, one or more embodiments may provide one or more of the following advantages:

Enables both Vt modulation as well as self-aligned contacts
  Vt shift through materials and process
  Reduces the need or eliminates channel doping (avoids short-channel penalty)
  Reduces the need or eliminates ground plane/back gate (avoids severe integration challenges)
  Enables simple process flow with gate-first integration
  Extends to planar PDSOI (partially depleted SOI)/bulk and FinFETs These and other features and advantages of the present invention will become apparent from the following detailed description of illustrative embodiments thereof, which is to be read in connection with the accompanying drawings.

BRIEF DESCRIPTION OF THE DRAWINGS

FIGS. 3-10 show exemplary steps in fabricating the transistors of FIGS. 1 and 2.

DETAILED DESCRIPTION OF PREFERRED EMBODIMENTS

As noted, scaling bulk technology beyond the 20 nm node faces formidable challenges, particularly for low power (LP) applications, partially due to the competing requirements of density, power, and performance, and partially due to increased device variation and parasitics. System-on-chip (SoC) applications require various sets of transistors to achieve optimal tradeoff between power and performance.

Furthermore, as also noted, as the pitch continues to scale, being able to land contacts in the correct location becomes more and more difficult. Full metal gate technology enables implementation of self-aligned contacts. Multiple threshold voltage (Vt) is a significant technology requirement for SoC applications. Fully depleted devices such as extremely thin silicon-on-insulator (ETSOI) or FinFET (fin-type field effect transistor) typically require work function tuning to obtain different Vt, which cannot be done through channel doping.

One or more embodiments provide a method and process to achieve multiple Vt devices (low, medium and high Vt) on the same chip for bulk or SOI (silicon-on-insulator) technologies. One or more embodiments are simpler than the prior art and overcome several challenges seen with current gate-first integration schemes. One or more embodiments also enable a full metal gate integration, which can be used for self-aligned contacts. One or more embodiments can be extended to non-planar devices such as FinFETs.

One or more embodiments use full metal gate stacks to achieve multiple Vt devices on the same chip. One or more instances enable both Vt modulation as well as self-aligned contacts; Vt shift through materials and process; reduces the need or eliminates channel doping (avoids short-channel penalty); reduces the need or eliminates ground plane/back gate (avoids severe integration challenges); enables simple process flow with gate-first integration; and/or are extendible to planar PDSOI/Bulk and FinFET technologies.

Figure 1:
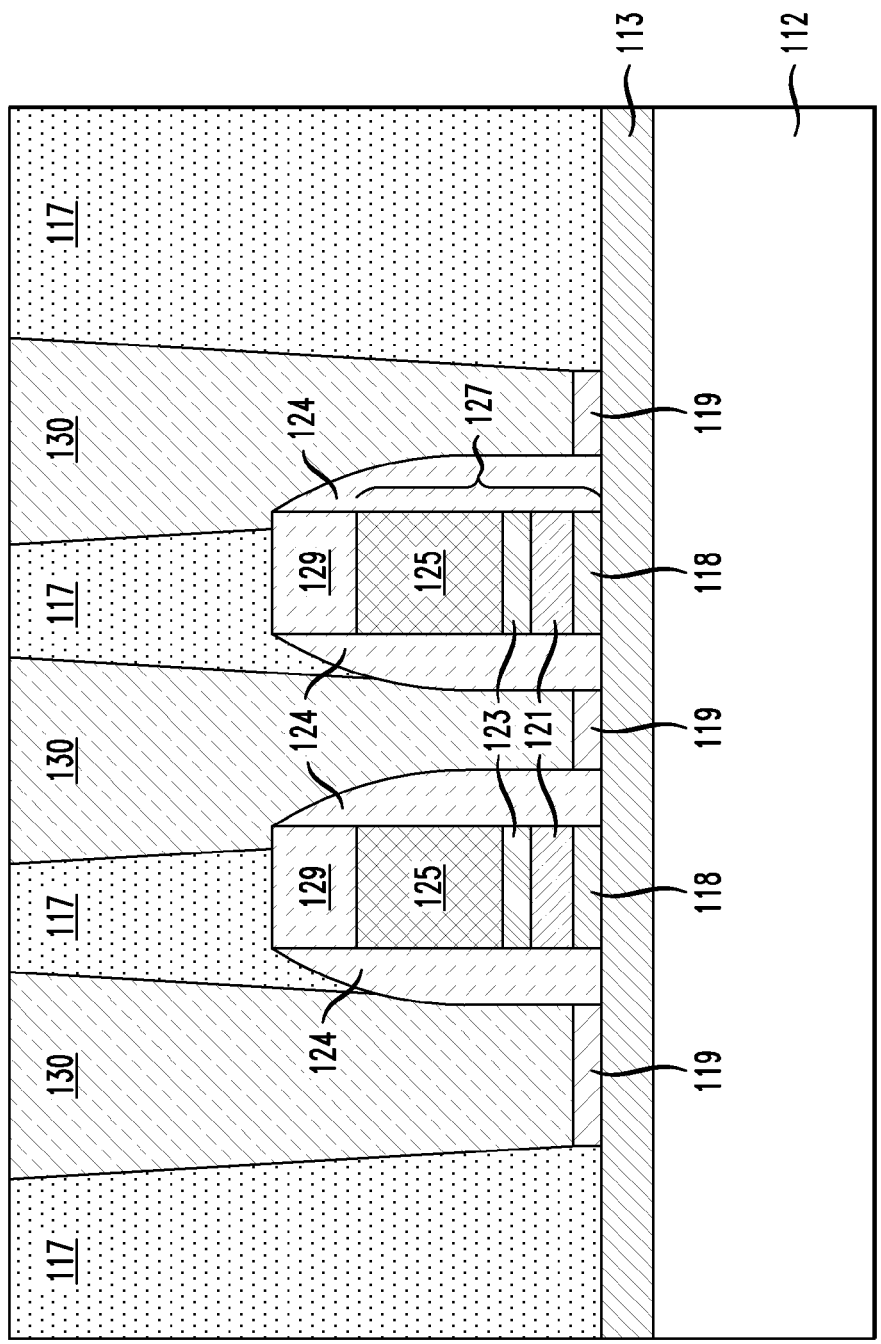
FIG. 1 shows a schematic of two transistors with full metal gates (FMG) integrated with self-aligned contacts (SAC)

FIG. 1 shows a schematic including a full metal gate (FMG) integrated with self-aligned contacts (SAC). Note substrate 112 with a channel 113 formed from silicon or any other suitable semiconductor. Note also that one or more embodiments can be implemented using a variety of technologies; for example, silicon-on insulator (SOI) as shown in the figure or bulk silicon. The gate dielectric is shown at 118 and silicided contacts at 119. Full metal gate stack 127 includes a first metal layer 121, a second metal layer 123, and a third metal layer 125. The full metal gate stack is topped off by gate hard mask 129 (for example, SiN) and has spacers 124 on either side (for example, SiN). The self-aligned contacts are shown at 130 and the same are separated by interlayer dielectric (insulator) 117. Non-limiting examples of suitable materials for insulator 117 include dielectrics such as silicon oxide and silicon nitride. Dielectric films can be deposited or spun on, for example. Conductive contacts 130 can be formed, for example, of tungsten, using known processes, or aluminum, using known processes.

Thus, in one or more embodiments a full metal gate (FMG) stack has insulator, a few layers of metal, and is then capped by silicon nitride or the like. The FMG is thus completely encapsulated so as not to be open to contact later on in the process. Silicon nitride is a preferred material for spacers and hard mask but any suitable insulator can be used.

For nMOS devices, high threshold voltage (HVT) options include a full metal gate (FMG) stack with no cap layer and a FMG stack with a "P" cap. Medium threshold voltage (MVT) options include a FMG stack with an "A" Cap and a FMG stack with an "A" cap and a "P" cap. Low threshold voltage (LVT) options include an FMG stack and an "A" cap.

For pMOS devices, HVT options include an FMG stack with an "A" cap; MVT options include an FMG Stack and an "A" cap, an FMG Stack, and "A" cap, and a "P" cap, or a thick FMG stack; and LVT options include a thin FMG stack.

In some instances, a full metal gate is employed on both nMOS and pMOS devices, as well as for analog and input/output (IO) devices. Capping layers are used in conjunction with the metal thickness in the FMG stack to modulate Vt.

Figure 2:
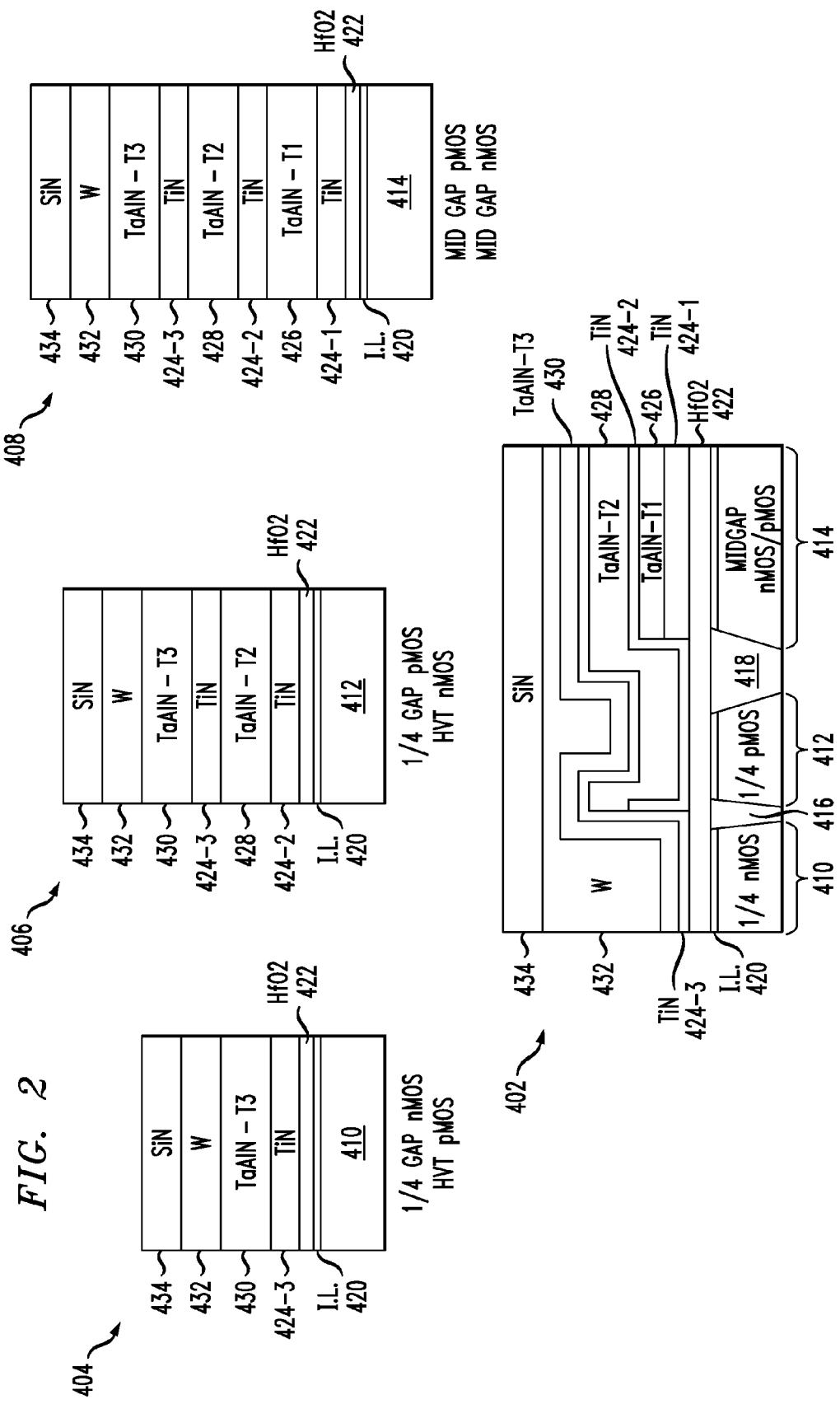
FIG. 2 shows cross-sectional views of a specific detailed embodiment analogous to the transistors of FIG. 1.

Attention should now be given to FIG. 2, which depicts an FMG gate stack for multiple Vt, in connection with a first illustrative embodiment. As noted, a full metal gate is employed on both nMOS and pMOS devices, as well as for analog and IO devices. Capping layers are used in conjunction with the metal thickness in the FMG stack to modulate Vt. In particular, note view 402 with view 404, a cross-section through the ¼ gap nMOS region 410; view 406, a cross-section through the ¼ gap pMOS region 412; and view 408, a cross-section through the mid-gap pMOS region 414. The notations "HVT pMOS," "HVT nMOS," and "mid gap nMOS" will be explained below. Regions 410, 412, 414 are formed on a suitable substrate (not shown) and are separated by isolation regions 416, 418. Regions 416, 418 can be formed, for example, from silicon oxide using the well-known shallow trench isolation process. Note interface layer 420, which can be formed, for example, from a suitable oxide or oxynitride grown on the silicon substrate before the high-k deposition. Note also Hafnium Oxide (HfO2) layer 422.

Refer now to view 404, which is analogous to FIG. 1. On top of the ¼ gap nMOS region 410 are the interface layer 420 and Hafnium Oxide layer 422. TiN layer 424-3 corresponds to metal 1, element 121 in FIG. 1; TaAlN-T3 layer 430 corresponds to metal 2, element 123 in FIG. 1; and tungsten layer 432 corresponds to metal 3, element 125 in FIG. 1. Finally SiN layer 434 corresponds to hard mask 129 in FIG. 1.

Refer now to view 406. On top of the ¼ gap pMOS region 412 are the interface layer 420 and Hafnium Oxide layer 422; TiN layer 424-2, TaAlN-T2 layer 428, TiN layer 424-3, TaAlN-T3 layer 430, and Tungsten layer 432. Finally note SiN (hard mask) layer 434.

Refer now to view 408. On top of the mid gap pMOS region 414 are the interface layer 420 and Hafnium Oxide layer 422; TiN layer 424-1, TaAlN-T1 layer 426, TiN layer 424-2, TaAlN-T2 layer 428, TiN layer 424-3, TaAlN-T3 layer 430, and Tungsten layer 432. Finally note SiN (hard mask) layer 434.

Figure 3:
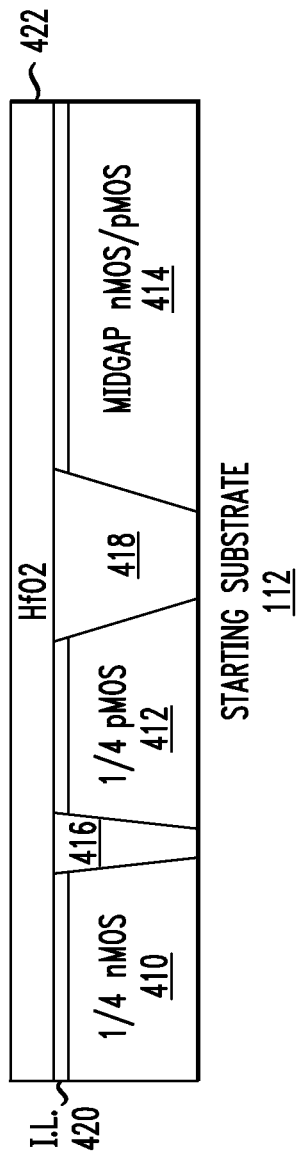

FIGS. 3-10 show exemplary steps in fabricating the transistors of FIGS. 1 and 2. In FIG. 3, deposit gate dielectric on all the devices. Note IL (interface layer) 420 and hafnium oxide (high-K dielectric) 422. Hafnium oxide is a preferred but non-limiting example; alternatives include any suitable material with a dielectric constant greater than 3.9, including materials such as zirconium oxide, lanthanum oxide, or titanium oxide, depending on the type of semiconductor.

Figure 4:
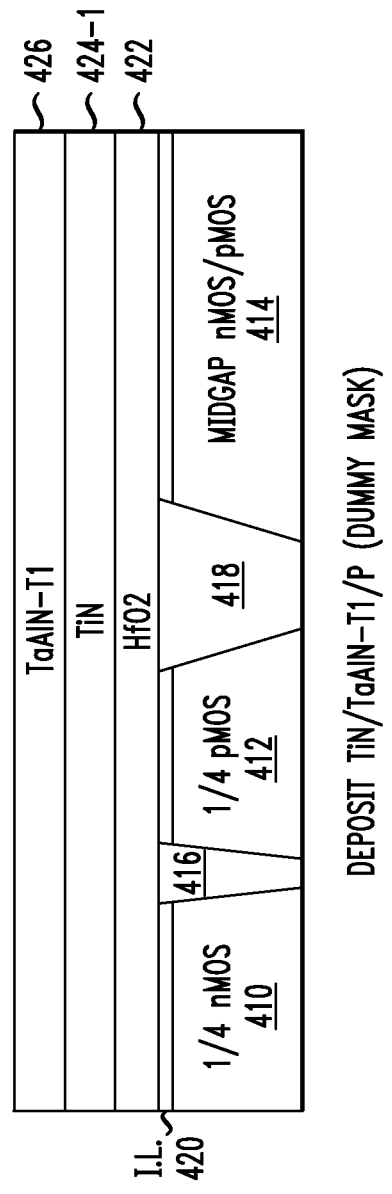

In FIG. 4, deposit the FMG stack on all devices. Note TiN layer 424-1 and TaAlN-T1 layer 426. The FIG. 4 stack has properties suitable for mid gap devices 414.

In FIG. 5, perform lithography to open up the pFET gate stack. Note Developer-Soluble Bottom Anti-Reflective Coatings (DBARC) 501 and photoresist 503. The patterning to open up the pFET gate stack is shown at 505.

In FIG. 6, etch the metal on the pFET device, as shown at 607, and stop on the gate dielectric selective to resist; then strip the resist.

Figure 7:
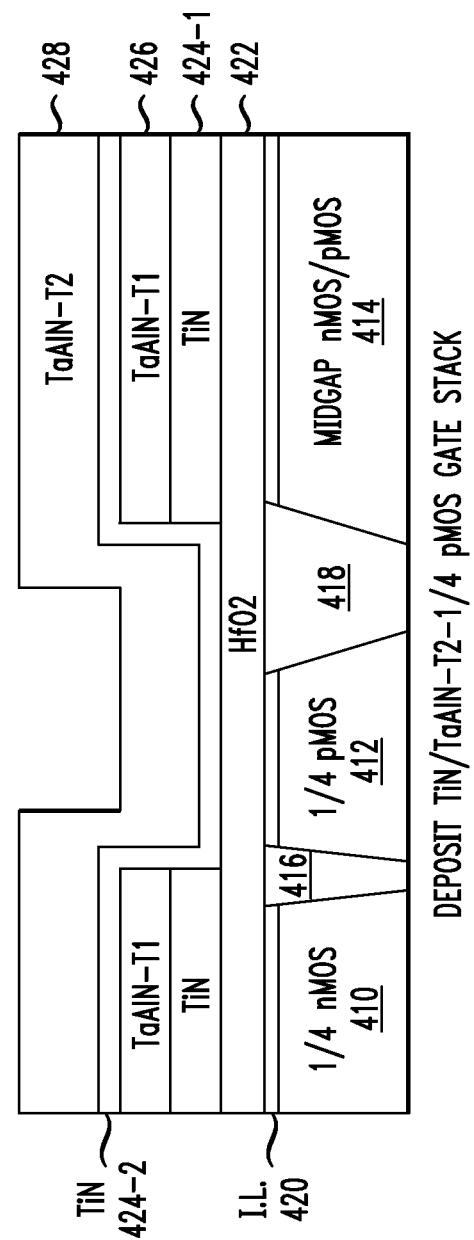

In FIG. 7, deposit the next materials for the PMOS device. In particular, deposit the second FMG stack, directly on the pFET gate dielectric over region 412.

Figure 8:
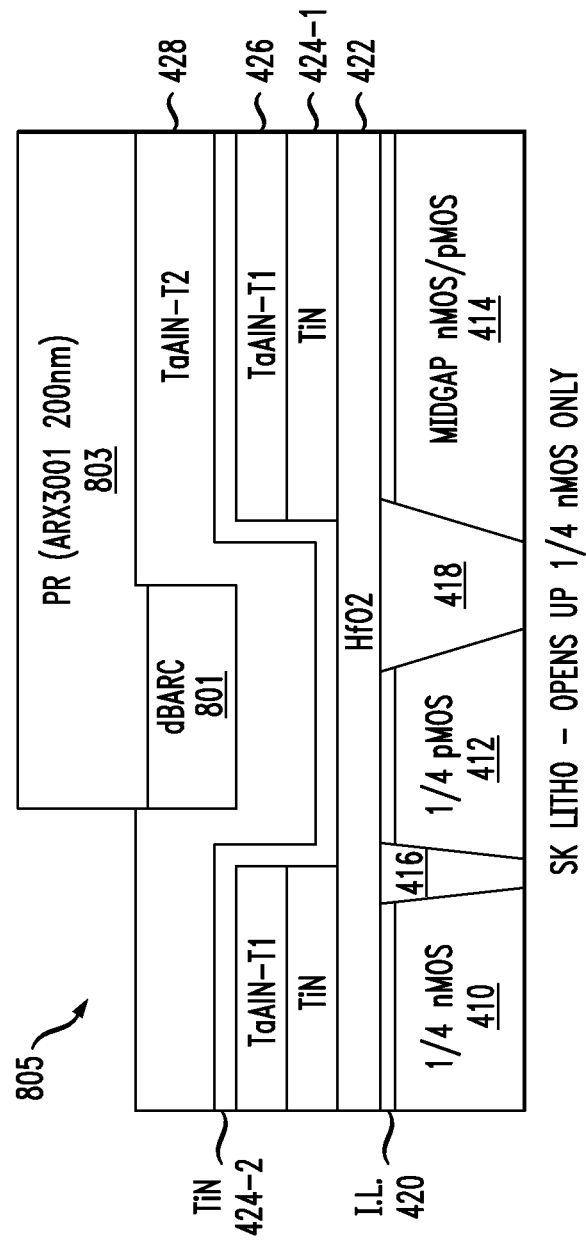

In FIG. 8, perform lithography to open up nFET gate stack. Note Developer-Soluble Bottom Anti-Reflective Coatings (DBARC) 801 and photoresist 803. The patterning to open up the pFET gate stack is shown at 805.

Figure 9:
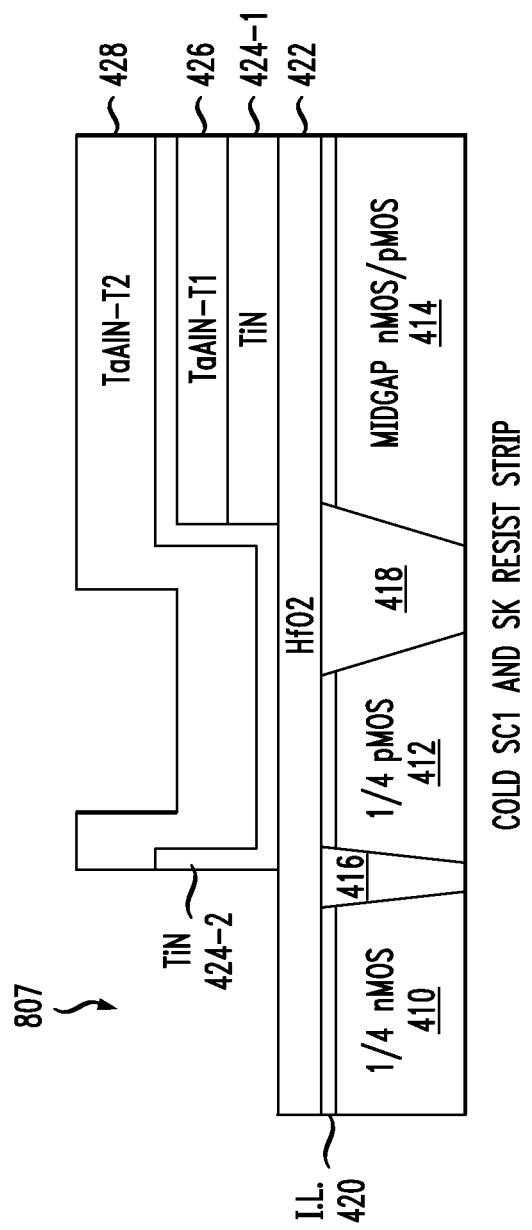

In FIG. 9, etch metal on the nFET device, as shown at 807, and stop on the gate dielectric selective to resist; then strip the resist.

Figure 10:
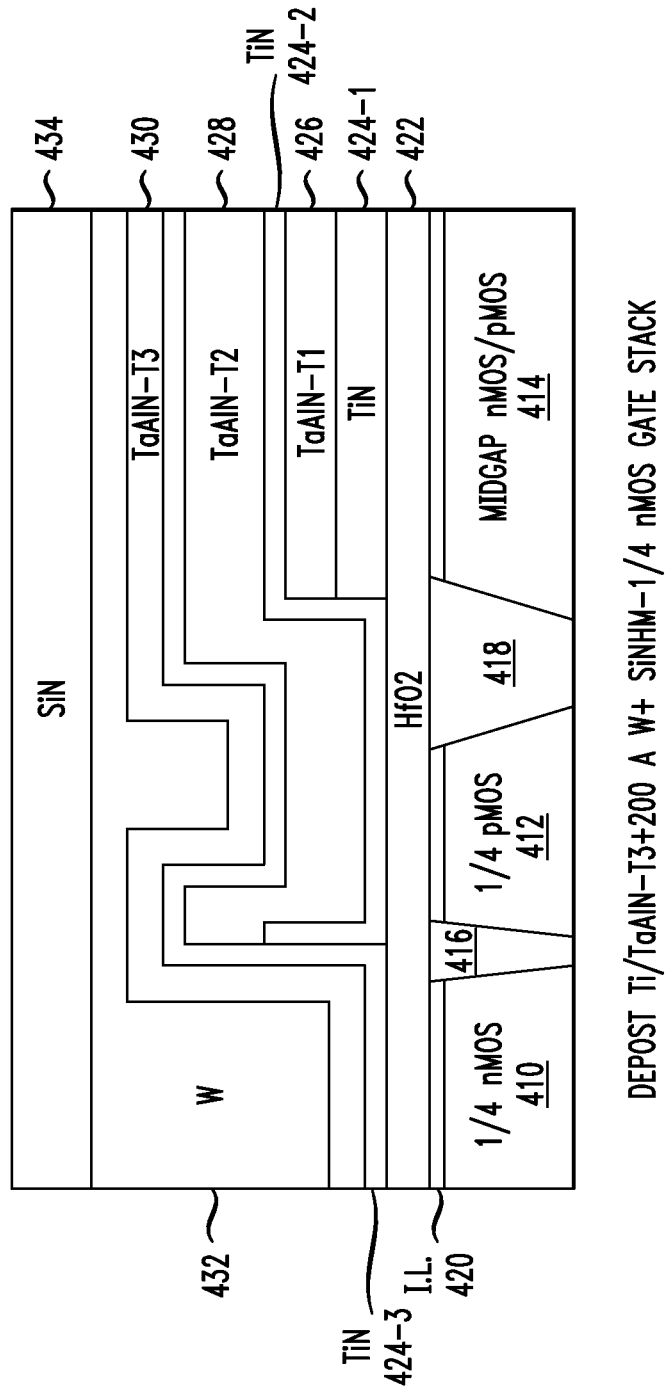

In FIG. 10, deposit the third FMG stack, for nMOS, over region 410. The third FMG stack is directly on the nFET gate dielectric, Thus, FIG. 10 shows deposition of the tungsten gate 432 and gate hard mask (nitride) 434. This step yields the final structure shown at 402 in FIG. 2, wherein all metal layers are encapsulated with SiN in the final product.

Various alternative embodiments are possible. For example, some embodiments use capping layers in conjunction with metal thickness in the FMG stacks to modulate Vt. For example, in FIG. 4, a capping layer could be added between layers 422 and 424-1; in FIG. 7, a capping layer could be added between layers 422 and 424-2; and in FIG. 10, a capping layer could be added between layers 422 and 424-3. Examples of capping layers are provided in the following paragraph.

Capping layers can be employed to provide additional nFET and pFET shift, depending on the specific capping layer employed. The choice of capping layer depends on what is adjacent. Typically, if adjacent to NFET, cap layers should use Group IIA and IIB elements (e.g., lanthanum oxide, magnesium oxide, or beryllium oxide); if adjacent to PFET, cap layers should use materials containing Al, Ge, or Ti (e.g., aluminum oxide, titanium oxide). Note, however, that these applications are to reduce Vt. In some cases, it may be desirable to increase Vt, in which case a PFET capping layer could be employed on NFET. The different types of capping layers can be referred to as work function lowering capping layers and work function increasing capping layers. Capping layers are, in general, analogous to a "knob" that can be used to adjust Vt. Referring again to FIG. 2, regions 404, 406, 408 represent stacks for ¼ gap nMOS, ¼ gap pMOS, and mid gap pMOS. However, this is for cases where it is desired to reduce Vt. If it is desired to increase Vt (HVT), the applications can be switched and stack 404 can be used for HVT pMOS and stack 406 can be used for HVT nMOS. The mid gap stack is essentially the same either way as indicated by the notation "mid gap nMOS" under the notation "mid gap pMOS."

Given the discussion thus far, it will be appreciated that, in general terms, an exemplary method, according to an aspect of the invention, includes the step of providing a substrate 112 having formed thereon a first region 412 and a second region 410 of a complementary type to the first region. Further steps include depositing over the substrate a gate dielectric 422; and depositing over the gate dielectric a first full metal gate stack 424-1, 426. It will be appreciated that the terms "first," "second," "third" and so on are for convenience and that, for example, a region or transistor designated as "first" in one portion of the claims or specification may be referred to as "second" in another portion of the claims or specification. Further, the term "gate stack" may be used in the description or claims to refer to the finished gate stack or an intermediate portion thereof during the fabrication process.

A further step includes removing the first full metal gate stack over the first region, as seen at 505, 607, to produce a resulting structure such a seen in FIG. 6, for example. Further steps include depositing over the resulting structure a second full metal gate stack 424-2, 428, in contact with the gate dielectric over the first region; and encapsulating the first and second full metal gate stacks such as with tungsten and SiN 432, 434.

In some instances, the resulting structure as seen in FIG. 6, for example, is a first resulting structure; and the substrate has formed thereon a third region 414. Additional steps in such a case can include, for example, removing the second full metal gate stack over the second region, as seen at 805, 807 to produce a second resulting structure such as seen in FIG. 9; depositing over the second resulting structure a third full metal gate stack 424-3, 430, in contact with the gate dielectric over the second region; and encapsulating the third full metal gate stack such as with tungsten and SiN 432, 434.

As best seen in FIG. 1, the encapsulating step produces a first encapsulation enclosing the first full metal gate stack and a second encapsulation enclosing the second full metal gate stack (see 124, 129). Further steps can include forming a silicified contact 119 between the first and second encapsulations; and forming a self-aligned contact 130 projecting from the siliceded contact.

As noted, capping layers can be formed between the gate dielectric 422 and the first, second, and or third full metal gate stacks (e.g., between gate dielectric 422 and layers 424-1, 424-2, and/or 424-3).

As noted, in one or more embodiments, metal thickness of the first and second full metal gate stacks is independently adjusted to modulate threshold voltage (this can also be done in conjunction with use of one or more capping layers).

As noted, where it is desired to reduce threshold voltage of a n-type transistor or increase threshold voltage of a p-type transistor, the capping layer can be formed of at least one of lanthanum oxide, magnesium oxide, and beryllium oxide over the gate dielectric; conversely, where it is desired to increase threshold voltage of a n-type transistor or decrease threshold voltage of a p-type transistor, the capping layer can be formed of at least one of aluminum oxide and titanium oxide over the gate dielectric.

In another aspect, an exemplary circuit structure includes a substrate 112 having formed thereon a first transistor having a source, a drain, and a channel 113; and a second transistor having a source, a drain, and a channel 113, and being of a complimentary type (e.g., n-type 410) to the first transistor (e.g., p-type 412). Also included are a first full metal gate stack formed over the channel of the first transistor and a second full metal gate stack formed over the channel of the second transistor (see generally gate stack 127 in FIG. 1 and exemplary different types of gate stacks in FIG. 2). A first encapsulation encloses the first full metal gate stack and a second encapsulation encloses the second full metal gate stack (see, e.g., elements 124, 129 in FIG. 1). A silicided contact 119 is located between the first and second encapsulations; and a self-aligned contact 130 projects from the silicided contact.

The first full metal gate stack is formed of material which tunes the first transistor to a first threshold voltage and the second full metal gate stack is formed of material which tunes the second transistor to a second threshold voltage different than the first threshold voltage.

Optionally, a third transistor, having a source, a drain, and a channel if also formed on the substrate; a third full metal gate stack is formed over the channel of the third transistor; a third encapsulation encloses the third full metal gate stack; another silicided contact is located between the second and third encapsulations; and another self-aligned contact projects from the another silicided contact. See generally FIG. 1 and also the three different regions and three different gate stacks in FIG. 2.

The third full metal gate stack is formed of material which tunes the third transistor to a third threshold voltage different than the first and second threshold voltages.

Again, a capping layer and a gate dielectric can be provided between the channels of the transistors and the corresponding full metal gate stacks; the capping layers are immediately adjacent the first full metal gate stack.

The method(s) as described above is/are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method comprising:
    providing a substrate having formed thereon a first region and a second region of a complementary type to said first region;
    depositing over said substrate a gate dielectric;
    depositing over said gate dielectric a first full metal gate stack;
    removing said first full metal gate stack over said first region to produce a resulting structure;
    depositing over said resulting structure a second full metal gate stack, in contact with said gate dielectric over said first region; and
    encapsulating said first and second full metal gate stacks;
    wherein said encapsulating step produces a first encapsulation enclosing said first full metal gate stack and a second encapsulation enclosing said second full metal gate stack;
    further comprising:
        forming a contact between said first and second encapsulations; and
        independently adjusting metal thickness of said first and second full metal gate stacks to modulate threshold voltage.

2. A method comprising:
    providing a substrate having formed thereon a first region and a second region of a complementary type to said first region;
    depositing over said substrate a gate dielectric;
    depositing over said gate dielectric a first full metal gate stack;
    removing said first full metal gate stack over said first region to produce a resulting structure;
    depositing over said resulting structure a second full metal gate stack, in contact with said gate dielectric over said first region; and
    encapsulating said first and second full metal gate stacks;
    wherein:
        said resulting structure comprises a first resulting structure;
        said substrate has formed thereon a third region;
    further comprising:
        removing said second full metal gate stack over said second region to produce a second resulting structure;
        depositing over said second resulting structure a third full metal gate stack, in contact with said gate dielectric over said second region; and
        encapsulating said third full metal gate stack.

3. The method of claim 2, wherein said encapsulating step produces a first encapsulation enclosing said first full metal gate stack and a second encapsulation enclosing said second full metal gate stack;
    further comprising:
        forming a silicided contact between said first and second encapsulations; and
        forming a self-aligned contact projecting from said silicided contact.

4. The method of claim 3, further comprising forming a capping layer between said gate dielectric and said first full metal gate stack.

5. The method of claim 3, further comprising forming a capping layer between said gate dielectric and said second full metal gate stack.

6. The method of claim 3, further comprising forming a capping layer between said gate dielectric and said third full metal gate stack.

7. The method of claim 3, further comprising independently adjusting metal thickness of said first and second full metal gate stacks to modulate threshold voltage.

8. The method of claim 3, wherein said second region comprises an n-type region, further comprising forming a capping layer comprising at least one of lanthanum oxide, magnesium oxide, and beryllium oxide over said gate dielectric in said second region to reduce threshold voltage.

9. The method of claim 3, wherein said second region comprises an n-type region, further comprising forming a capping layer comprising at least one of aluminum oxide and titanium oxide over said gate dielectric in said second region to increase threshold voltage.

10. The method of claim 3, wherein said first region comprises a p-type region, further comprising forming a capping layer comprising at least one of aluminum oxide and titanium oxide over said gate dielectric in said first region to reduce threshold voltage.

11. The method of claim 3, wherein said first region comprises a p-type region, further comprising forming a capping layer comprising at least one of lanthanum oxide, magnesium oxide, and beryllium oxide over said gate dielectric in said first region to increase threshold voltage.

12. A method comprising:
    providing a substrate having formed thereon a first region and a second region of a complementary type to said first region;
    depositing over said substrate a gate dielectric;
    depositing over said gate dielectric a first full metal gate stack;
    removing said first full metal gate stack over said first region to produce a resulting structure;
    depositing over said resulting structure a second full metal gate stack, in contact with said gate dielectric over said first region; and
    encapsulating said first and second full metal gate stacks;
    wherein said encapsulating step produces a first encapsulation enclosing said first full metal gate stack and a second encapsulation enclosing said second full metal gate stack;
    further comprising:

forming a contact between said first and second encapsulations; and forming a capping layer over said gate dielectric in at least one of said first and second regions to modify threshold voltage.

* * * * *